(12) United States Patent
Campagna et al.

(10) Patent No.: US 10,198,048 B2
(45) Date of Patent: Feb. 5, 2019

(54) MEDIA DEVICE ENCLOSURE SYSTEM

(71) Applicant: Ciil Technologies, LLC, Aurora, IL (US)

(72) Inventors: Michael A. Campagna, Plainfield, IL (US); Justin Myers, Plainfield, IL (US); Steven Sagerian, Plainfield, IL (US)

(73) Assignee: Peerless Industries, Inc., Aurora, IL (US)

( * ) Notice: Subject to any disclaimer, the term of this patent is extended or adjusted under 35 U.S.C. 154(b) by 333 days.

(21) Appl. No.: 15/025,802

(22) PCT Filed: Oct. 2, 2014

(86) PCT No.: PCT/US2014/058794
§ 371 (c)(1),
(2) Date: Mar. 29, 2016

(87) PCT Pub. No.: WO2015/051100
PCT Pub. Date: Apr. 9, 2015

(65) Prior Publication Data
US 2016/0246340 A1    Aug. 25, 2016

Related U.S. Application Data

(60) Provisional application No. 61/886,372, filed on Oct. 3, 2013.

(51) Int. Cl.
*G06F 1/20* (2006.01)
*F25B 21/04* (2006.01)
*G05B 19/406* (2006.01)

(52) U.S. Cl.
CPC .............. *G06F 1/206* (2013.01); *F25B 21/04* (2013.01); *G05B 19/406* (2013.01);
(Continued)

(58) Field of Classification Search
CPC ........ G06F 1/206; F25B 21/04; G05B 19/406
(Continued)

(56) References Cited

U.S. PATENT DOCUMENTS 4,259,843 A * 4/1981 Kausch ................. H05K 7/202
                                                      62/3.1
4,724,278 A * 2/1988 Smith ....................... H02G 9/10
                                                      174/100
(Continued)

OTHER PUBLICATIONS

International Search Report and Written Opinion for PCT/US2014/058794, dated Mar. 3, 2015, 11 pages.

*Primary Examiner* — Anthan Tran
(74) *Attorney, Agent, or Firm* — Foley & Lardner LLP (57) ABSTRACT

An enclosure system with a temperature control system including an enclosure, a thermoelectric module having first and second portions, and a thermal controller. The enclosure includes a main body with an open end, a cover coupled to the open end of the main body, and an interior sized and configured to receive an electronic device therein, the interior defined by the main body and the cover. The enclosure further includes a sealing member provided at an interface between the main body and the cover such that the interface is substantially sealed and resistant to liquid ingress. The first portion is positioned within the interior. The second portion is coupled to or is otherwise in contact with a portion of the enclosure exposed to an external environment. The thermal controller is electrically coupled to the thermoelectric module and operable to control heating and/or cooling of a portion of the thermoelectric module.

18 Claims, 4 Drawing Sheets

(52) U.S. Cl.
CPC ................... *F25B 2321/023* (2013.01); *G05B 2219/49206* (2013.01); *H01L 2924/0002* (2013.01)

(58) Field of Classification Search
USPC ......................................................... 700/300
See application file for complete search history.

(56) References Cited

U.S. PATENT DOCUMENTS

| | | | | |
|---|---|---|---|---|
| 5,067,040 A | * | 11/1991 | Fallik | ......................... G06F 1/20 361/679.48 |
| 6,499,306 B2 | * | 12/2002 | Gillen | ..................... F25B 21/04 62/129 |
| 2009/0139245 A1 | * | 6/2009 | Blackway | ............... F25B 21/02 62/3.62 |

* cited by examiner

MEDIA DEVICE ENCLOSURE SYSTEM

CROSS-REFERENCE TO RELATED PATENT APPLICATIONS

The present application is a U.S. national stage application claiming the benefit of International Application No. PCT/US2014/058794, filed on Oct. 2, 2014, which claims the benefits of and priority to U.S. Provisional Patent Application 61/886,372, which was that filed Oct. 3, 2013. The entire contents of these applications are incorporated herein by reference in their entirety.

FIELD

The present application relates generally to structures for enclosing electronic devices. More particularly, the present application relates to sealed enclosures including systems for heating and/or cooling electronic devices and/or the interior of the enclosure.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Electronic devices such as computers, media players, servers, etc. might be located outdoors in various residential and commercial settings for entertainment or marketing purposes, potentially exposing the electronic device to damaging rain, snow, debris, and other elements. Electronic devices might also be located in indoor environments such as restrooms, kitchens, and industrial settings for various entertainment, marketing, and informational purposes. As with outdoor applications, liquids and other potential contaminants may be near or come into contact with the mounted electronic device, potentially damaging or degrading the performance of the electronic device. It is desirable to protect the electronic device from exposure to environmental and other potential contaminants, which can represent a substantial cost. Accordingly, various enclosures have been developed that are intended to protect an electronic device from the elements and other containments to permit locating such displays outdoors and in other potentially inhospitable environments.

When the electronic device is within the enclosure, the temperature within the enclosure may vary depending on the environment. For example, in an outdoor environment with cold temperatures, the interior temperature within the enclosure may be similarly cold, which may affect the operation of the electronic device. Similarly, in an outdoor environment with hot temperatures, the interior temperature within the enclosure may be similarly hot, which may affect the operation of the display device (e.g., overheating electronics components within the electronic device, etc.).

SUMMARY

One embodiment relates to an electronic device enclosure system with a temperature control system including an enclosure, a thermoelectric module, and a thermal controller. The enclosure includes a main body with an open end, a cover configured to be coupled to the open end of the main body, and an interior sized and configured to receive an electronic device therein, the interior defined by the main body and the cover. The enclosure further includes a sealing member provided at an interface between the main body and the cover such that the interface is substantially sealed and resistant to liquid ingress. The thermoelectric module has a first portion and a second portion. The first portion is positioned within the interior of the enclosure. The second portion is coupled to or otherwise in contact with a portion of the enclosure exposed to an external environment. The thermal controller is electrically coupled to the thermoelectric module and operable to control heating and/or cooling of the first portion of the thermoelectric module.

Another embodiment relates to an electronic device enclosure system. A main body includes with an open end that defines an interior space sized to receive a media device therein. A cover is detachably coupled to the main body at the open end so as to enclose the interior space. A sealing member is provided between the main body and the cover, the sealing member prohibiting the ingress of liquid into the interior space between the main body and the cover. A thermoelectric module is configured to receive an electric current, the thermoelectric module having first and second portions. When the thermoelectric module receives a first electric current, the first portion is cooled and the second portion is heated, and when the thermoelectric module receives a second electric current, the first portion is heated and the second portion is cooled.

Yet another embodiment relates to an electronic device enclosure system. A main body includes a plurality of walls that define an open end and an interior space sized to receive a media device therein. A cover is detachably coupled to the main body at an interface at the open end of the main body so to enclose the interior space, such that the ingress of liquid into the interior space through the interface is prohibited. At least one vent is coupled to one of the main body and the cover. Each vent prohibits the ingress of liquid and selectively allowing the ingress and egress of air through a vent opening therein. At least one valve is coupled to one of the main body and the cover. Each valve selectively allows a flow of air in one direction through a valve opening.

BRIEF DESCRIPTION OF THE DRAWINGS

These and other features, together with the organization and manner of operation thereof, will become apparent from the following detailed description when taken in conjunction with the accompanying drawings, wherein like elements have like numerals throughout the several drawings described below.

DETAILED DESCRIPTION

Figure 1:
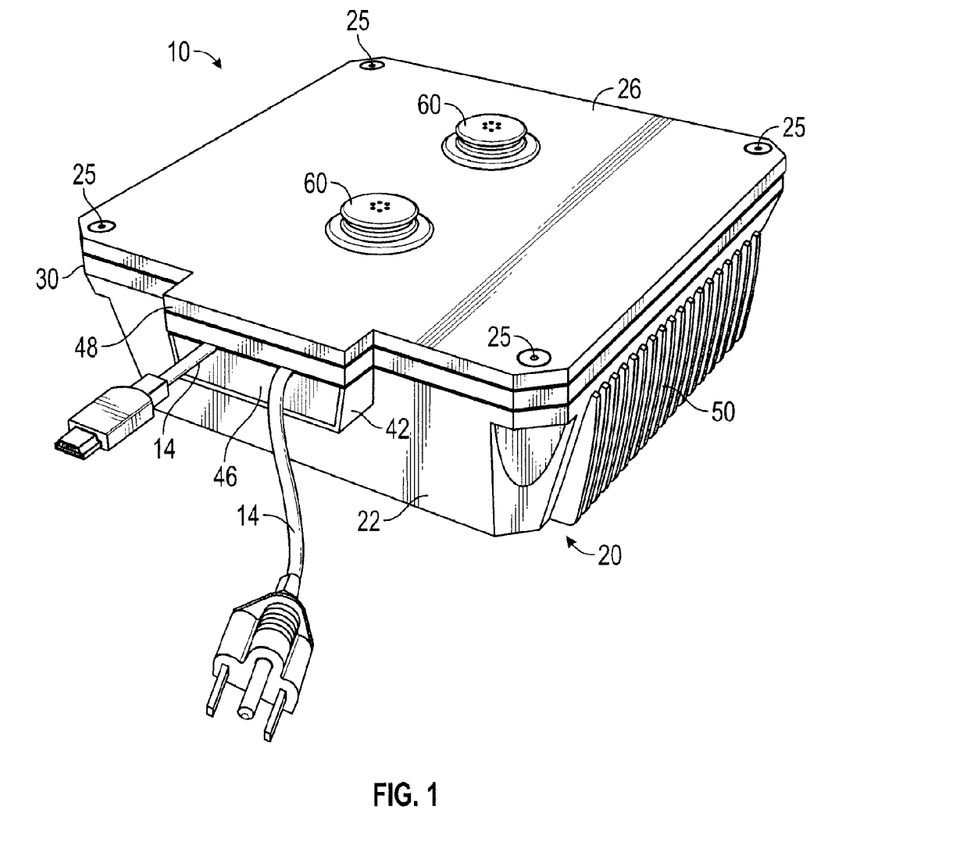
FIG. 1 is a top front perspective view of an enclosure for a media device, in accordance with an exemplary embodiment.
Figure 2:
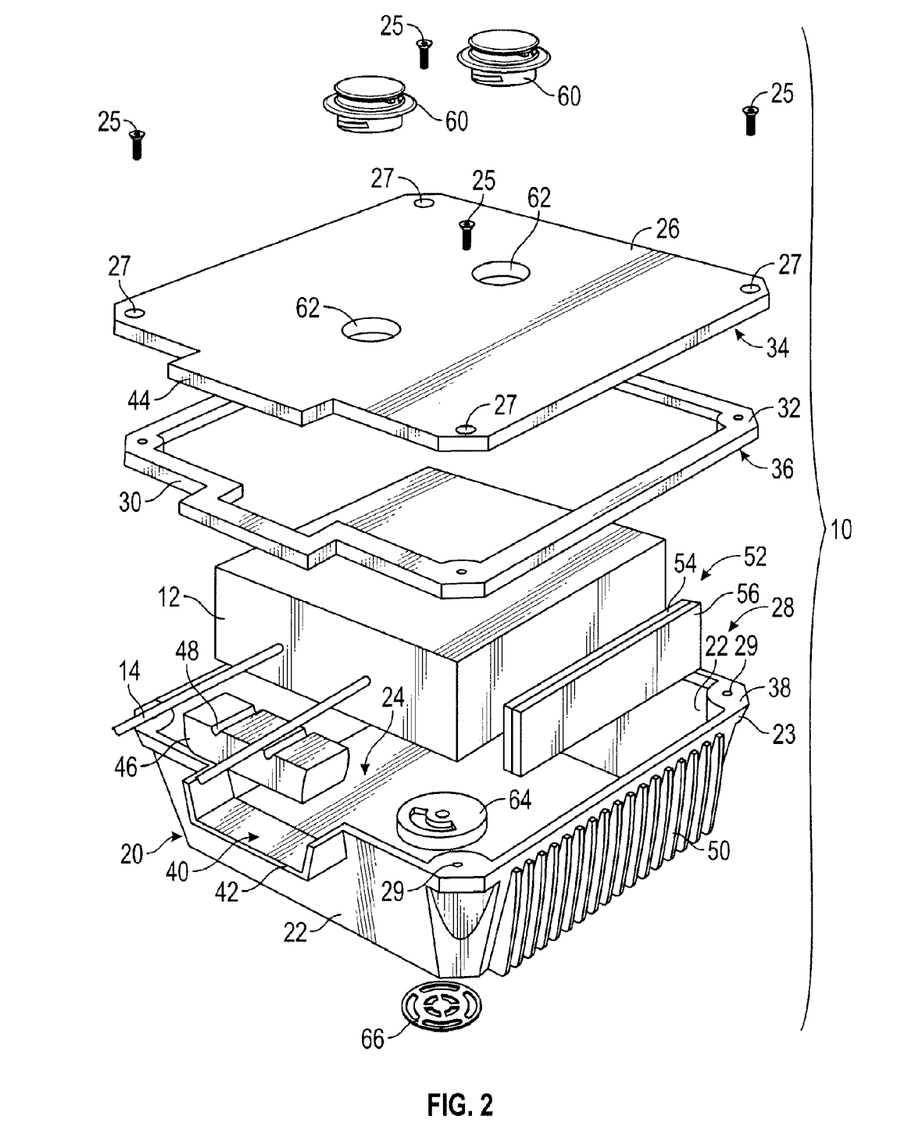
FIG. 2 is an exploded view of the enclosure of FIG. 1.
Figure 3:
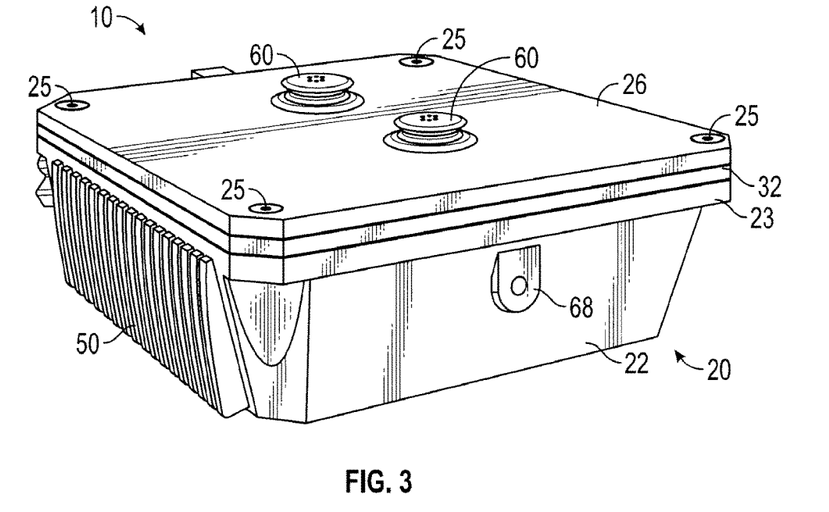
FIG. 3 is a top rear perspective view of the enclosure of FIG. 1.
Figure 4:
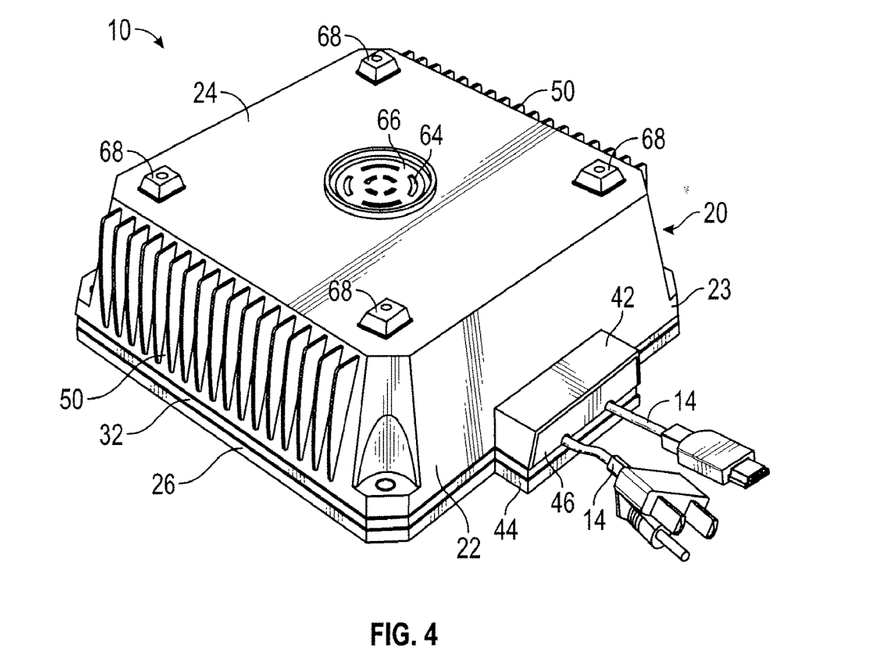
FIG. 4 is a bottom perspective view of the enclosure of FIG. 1.

Referring to FIGS. 1-2, a weatherproof enclosure 10 is shown according to an exemplary embodiment. The enclosure 10 is a protective container sized and configured to house an electronic device 12. The electronic device 12 may be, for example, media device, such as a media player, or a small form factor computer (e.g., compact PC). The enclosure 10 provides a barrier between the electronic device 12 and the exterior environment to facilitate the use of the electronic device 12 in a variety of outdoor environments where the electronic device 12 requires or may benefit from protection from ambient conditions (e.g., a low temperature environment, a high temperature environment, precipitation, etc.). As described in greater detail below, the enclosure 10 may be provided with features that enable or enhance performance and operation under various ambient conditions, while protecting the electronic device 12 from adverse conditions, such as liquids that may come into contact with the enclosure 10 or varying ambient temperatures.

The enclosure 10 is configured to resist and substantially prevent ingress of various liquids that may be encountered, including precipitation when the enclosure 10 is mounted for outdoor use of the electronic device 12. In various embodiments, the enclosure 10 is configured to prevent ingress of rain, snow and splashing liquid. In one embodiment, the enclosure 10 is configured to prevent ingress of liquid at a submersed depth of up to five feet of water, which may correspond to a modified rating of IP68 under the ingress protection (IP) standard promulgated by the International Electrotechnical Commission (IEC). (the contents of which are incorporated herein by reference).

The enclosure 10 is further configured to be capable of maintaining the interior of the enclosure 10 in a desired temperature range for the operation of the electronic device 12 when the enclosure 10 is mounted for outdoor use of the electronic device 12 in a wide range of ambient temperatures. In various embodiments, the enclosure 10 may include both passive and active mechanisms configured to transfer heat into or out of the interior of the enclosure 10. In one particular embodiment, the enclosure 10 is configured to maintain the interior of the enclosure 10 in a desired temperature range for the operation of the electronic device 12 when the enclosure 10 is exposed to ambient temperatures of between −40° F. and 140° F.

The enclosure 10 includes a main body 20 with sidewalls 22 and a floor or base 24. The enclosure further includes a cover 26 that is coupled to an open end 28 of the main body 20 to define the interior of the enclosure 10. According to an exemplary embodiment, the main body 20 is a rectangular, box-like structure with four sidewalls 22 oriented normal to the base 24. A flange 23 extends about the upper edge of the sidewalls 22. The interior of the enclosure 10 is sized to receive the electronic device 12. In other embodiments, the sidewalls 22 may be inclined relative to the base 24 at an angle greater than or less than 90 degrees.

The main body 20 is formed of a material that can withstand a wide range of ambient temperatures (e.g., a material that does not become overly brittle at lower ambient temperatures in the winter or does not melt or distort at higher ambient temperature in the summer) and can withstand moisture and various types of precipitation that may be encountered in an exterior environment. The main body 20 may be formed from a material with a relatively high thermal conductivity (e.g., a thermal conductivity greater than or equal to approximately 160-180 W/m·K at 300 K—typical values of thermal conductivity of aluminum alloys) to facilitate the removal of excess heat from the interior of the enclosure 10. According to an exemplary embodiment, the main body 20 is formed as a unitary body from a metal with a relatively high thermal conductivity (e.g., an aluminum alloy). In other embodiments, the sidewalls 22 may be formed separately from the base 24 and may be coupled to the base 24 (e.g., with mechanical fasteners, welds, etc.). In other embodiments, the main body 20 may be formed of another material, such as a polymer (e.g. thermoplastic, thermoset, etc.) or a composite material (e.g., a fiberglass-reinforced polymer). The main body 20 may be formed by any suitable manufacturing process, including, but not limited to molding, forging, stamping, machining, etc.

The cover 26 may be formed from the same material as the main body 20 or may be formed from a different material. The cover 26 is coupled to the main body 20 to form the closed enclosure 10. According to one exemplary embodiment, the cover 26 is coupled to the main body 20 with a multitude of mechanical fasteners, shown in FIGS. 1-4 as threaded fasteners 25 passing through openings 27 in the cover 26 to engage threaded openings 29 in the main body 20. In other embodiments, threaded fasteners (e.g., threaded posts) may be coupled to the main body 20 and extend upward to be received in the openings 27 in the cover 26. The cover 26 may then be secured to the main body 20 with nuts threaded onto the threaded posts. In other embodiments, another fastener may be utilized to couple the cover 26 to the main body 20, such as a clamp or clip. In still other embodiments, the cover 26 may be otherwise coupled to the main body 20. For example, the cover 26 may include an integrally formed coupling feature that engages an integrally formed coupling feature of the main body 20, such as one or more snap features.

A sealing member 30 is provided between the cover 26 and the main body 20 to resist the ingress of liquids into the interior of the enclosure 10 at the interface between the main body 20 and the cover 26. The sealing member 30 is a deformable body that is compressed between the cover 26 and the main body 20. In various exemplary embodiments, the sealing member 30 may be formed of any suitable compressible material including, but not limited to Teflon, fluorosilicone, urethane, HNBR, polyacrylate, neoprene, butyl, hypalon, rubber, or the like. As shown in FIG. 2, the sealing member 30 may be a flat member with a first surface 32 that contacts a surface 34 of the cover 26 and a second surface 36 that contacts an end surface 38 of the flange 23 of the main body 20. The sealing member 30 may be affixed to the main body 20 or the cover 26, such as with an adhesive. In another embodiment, the sealing member may comprise another body, such as an o-ring.

The enclosure 10 may include a cable entry portion 40 that permits passage of various power, video, audio, and other data carrying cables to the electronic device 12 in the interior of the enclosure 10. According to an exemplary embodiment, one of the sidewalls 22 includes an outwardly extending neck 42. The cover 26 includes an outwardly extending projection 44 that is aligned with the neck 42 when the cover 26 is coupled to the main body 20.

A sealing member 46 is received in the cable entry portion 40 between the cover 26 and the main body 20 to resist the ingress of liquids into the interior of the enclosure 10 through the cable entry portion 40. The sealing member 46 is a deformable body, such as a foam block that is compressed between the cover 26 and the main body 20. In various exemplary embodiments, the sealing member 30 may be formed of any suitable compressible material including, but not limited to Teflon, fluorosilicone, urethane, HNBR, polyacrylate, neoprene, butyl, hypalon, rubber, or the like. The sealing member 46 may include one or more passages to permit cables 14 to pass through the cable entry portion 40, shown in FIG. 2 as grooves 48. In one embodiment, the grooves 48 have a semicircular cross-section. The grooves 48 may have a diameter that is less than the diameter of the cables 14 such that cables 14 deform the sealing member 46 when they are inserted into the grooves 48. In other embodiments, the grooves 48 may have another shaped cross-section (e.g., rectangular, oval, triangular, etc.). In other embodiments, the cables 14 may be received in slits in the sealing member 46. The sealing member 46 may be affixed to the main body 20 or the cover 26, such as with an adhesive.

The enclosure 10 may include one or more heat sink portions 50 to facilitate the passive heat transfer abilities of the enclosure 10. According to one exemplary embodiment, the heat sink portions 50 include a multitude of fins provided along the exterior surfaces of one or more of the sidewalls 22 to increase the surface area of the main body 20. In other exemplary embodiments, additional heat sink portions 50 may be provided on the base 24 or on the cover 26. In other exemplary embodiments, heat sink portions 50 may be provided on the interior surfaces of the enclosure in addition to or instead of the exterior surfaces.

The enclosure 10 may also include an active heating and/or cooling system for thermal management of the internal temperature within the enclosure 10 and in maintaining an internal temperature that is within an operating range of the electronic device 12. The heating and/or cooling system may include a thermoelectric module 52, and more particularly a Peltier thermoelectric module, shown schematically in FIG. 2 as a panel provided along one of the sidewalls 22. One example of such a Peltier thermoelectric module is a TEC1-12705 Thermoelectric Peltier Cooler available from Hebei I.T. (Shanghai) Co., Ltd. of Shanghai, China. The Peltier thermoelectric module of the present example is a silicon device having a first portion 54 and a second portion 56. The first portion 54 may be positioned within an interior of the enclosure 10 and the second portion 56 may be coupled to or is otherwise in contact with a portion of the enclosure 10 that is exposed to the external environment. When an electric current is applied to the thermoelectric module 52 in a first direction, the first portion 54 is cooled and the second portion 56 is heated. When the electric current is applied to the module 52 in a second direction, substantially opposite the first direction, the first portion 54 is heated and the second portion 56 is cooled. Accordingly, it may be appreciated that the internal temperature of the enclosure 10 may be actively regulated, by heating or cooling the first portion 54, using the thermoelectric module 52. The thermoelectric module 52 is electrically coupled to a power source to provide operating power to the thermoelectric module 52. In some implementations, a plurality of thermoelectric modules 52 may be provided to form a thermoelectric module array.

According to an exemplary embodiment, the thermoelectric module 52 is coupled to a sidewall 22 of the main body 20. In other embodiments, the enclosure 10 may include thermoelectric modules 52 coupled to one or more of the sidewalls 22, the base 24, or the cover 26. In some embodiments, the first portion 54 of the thermoelectric module or modules 52 may be aligned with a portion of the electronic device 12 that is thermally sensitive or otherwise may benefit from thermal management. For example, the first portion 54 may be positioned within the enclosure 10 such that the first portion 54 is substantially aligned with a location for a power supply module of the electronic device 12 and/or of the enclosure 10. In other embodiments, the first portion 54 may be positioned such that the first portion 54 is substantially aligned with the electronic device 12 at other locations (e.g., near a processor or processing module, a computer-readable storage device, etc.) and/or other components of the enclosure 10. In still other embodiments, the thermoelectric module or modules 52 and the first portion 54 may be arbitrarily positioned within the enclosure 10.

In some embodiments, the second portion 56 of each thermoelectric module or modules 52 may be coupled to a sidewall 22 for heat transfer to the heat sink portion 50 of the main body 20. For example, the thermoelectric module 52 and the sidewall 22 may be coupled together (e.g., via connecting elements such as bolts, screws, latches, clamps, clips, etc. via adhesives, or otherwise) and may include a thermally conductive grease or adhesive interposed between the second portion 56 and the heat sink portion sidewall. Thus, the second portion 56 is conductively coupled to the heat sink portion 50 of the sidewall 22. In other embodiments, the thermoelectric module 52 may be integrated or embedded in the main body 20 or the cover 26 (e.g., a recess may be formed in the sidewall 22 for the thermoelectric module 52 to be embedded). In yet a further configuration, the sidewall 22 may include an opening for the second portion 56 to be exposed to the external environment. In some embodiments, a plurality or an array of thermoelectric modules 52 may be positioned within the enclosure 10.

The enclosure may further include other components to facilitate the heating and/or cooling of the electronic device in the interior of the enclosure 10. In one embodiment, an internal fan may be positioned in the interior of the enclosure 10 (e.g., above and/or adjacent to the thermoelectric module 52 to increase air flow over the first portion 54 to increase the convective heating or cooling of the interior of the enclosure 10). The enclosure 10 may include multiple internal fans located within the enclosure 10. Each internal fan may circulate air within the enclosure 10, mitigating thermal gradients or hot spots on, for example, a surface of the electronic device 12 and regions within the enclosure 10. In another embodiment, a second heat sink may be thermally coupled to the first portion 54 to increase the convective surface on the interior of the enclosure 10 as well. The internal fan may be positioned adjacent to and/or above the second heat sink to increase the airflow through the heat sink fins.

Active heat transfer components such as the thermoelectric modules 52 and internal fans may be controlled with a thermal controller. In one embodiment, the thermal controller may receive signals from sensors such as temperature sensors (e.g., a thermistor, a thermocouple, a resistance temperature detector, etc.) or humidity sensors to monitor the internal conditions of the enclosure 10 and control the operation of the one or more thermoelectric modules 52 and the internal fans. The thermal controller may be provided within the interior of the enclosure 10 or may be provided outside or on the surface of the enclosure 10.

The enclosure 10 may include one or more devices to allow for air to selectively pass between the outside environment and the interior of the enclosure 10, such as one or more vents 60 and one or more valves 64. The vents 60 are received in a vent opening 62 in the enclosure 10. In a particular embodiment, each vent 60 is an IP68 rated vent plug that allows the ingress and egress of air through the vent opening 62 but does not allow the ingress of water or other liquids into the interior of the enclosure 10. According to an exemplary embodiment, the enclosure 10 includes two vents 60 in the cover 26. In other embodiments, the enclosure 10 may include more or fewer vents 60 in the cover 26 and/or the main body 20. The valves 64 are received in an opening in the enclosure 10 and is covered by a cover 66. In a particular embodiment, the valves 64 comprise check valves configured to allow the passage of air in one direction through the opening in the enclosure 10. According to an exemplary embodiment, each valve 64 is oriented such that allows the egress of air from the interior of the enclosure 10 while preventing the ingress of air into the interior of the enclosure 10. The valves 64 therefore allow air to escape the interior of the enclosure 10 if the pressure in the interior of the enclosure increases to a pressure a predetermined amount above the external atmospheric pressure.

The enclosure 10 may be mounted in an outdoor location. According to an exemplary embodiment, the enclosure 10 includes one or more mounting bosses 68 on an exterior surface. The mounting bosses 68 include an opening and a structure for receiving a fastener to mount the enclosure 10 to a structure. The mounting bosses 68 may include threaded openings configured to receive threaded fasteners or may include unthreaded openings (e.g., holes, slots, etc.) through which a fastener may pass (e.g., a threaded fastener engaging a nut on the interior of the enclosure). In other embodiments, enclosure 10 may include integrally formed features (e.g., hooks, slots, hollows, etc.) for mounting the enclosure 10 to a structure. In other embodiments, the enclosure 10 may be mounted to a structure with an adhesive or by any other suitable method.

Figure 5:
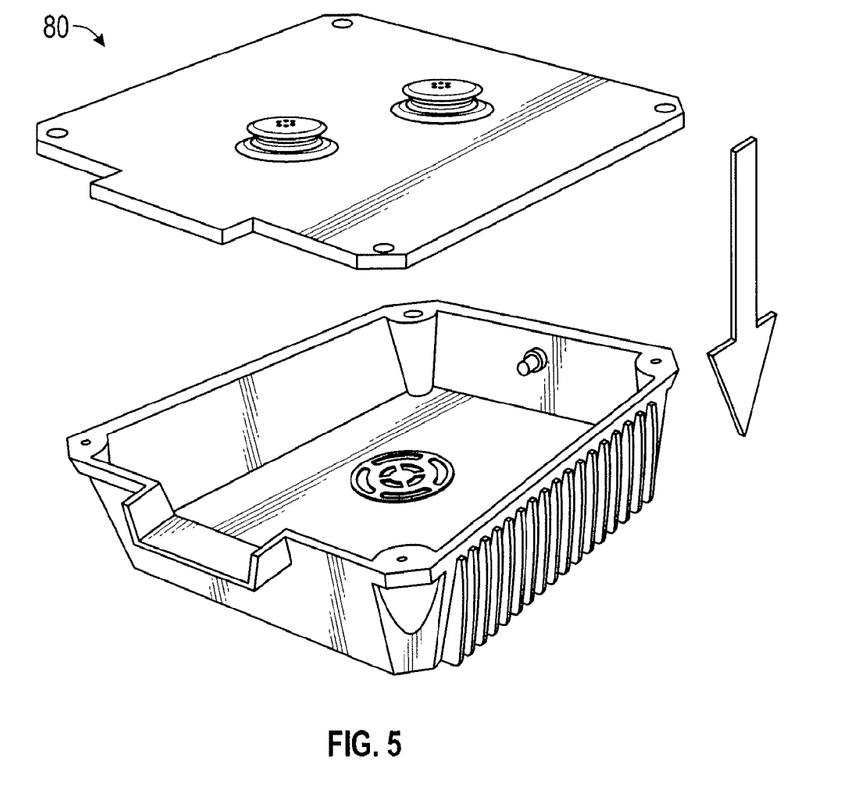
FIG. 5 is a top front perspective view of an enclosure for a media device, in accordance with another exemplary embodiment.
Figure 6:
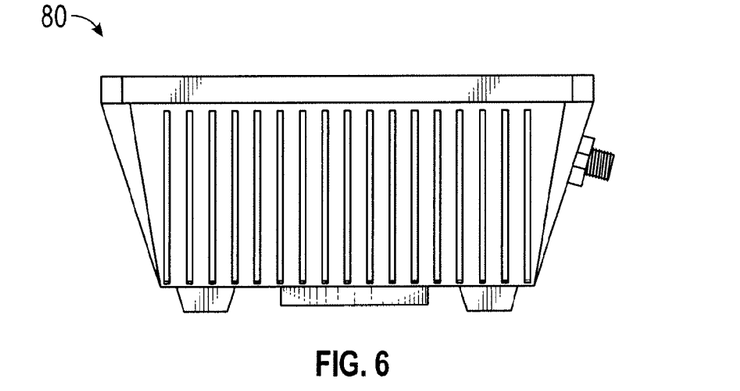
FIG. 6 is a side view of the enclosure of FIG. 5.

Referring to FIGS. 5-6, an enclosure 80 is shown according to another exemplary embodiment. The enclosure 80 may be similar in construction and function to the enclosure 10 as described above.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims. Additionally, it is noted that limitations in the claims should not be interpreted as constituting "means plus function" limitations under the United States patent laws in the event that the term "means" is not used therein.

The terms "coupled," "connected," and the like as used herein mean the joining of two components directly or indirectly to one another. Such joining may be stationary (e.g., permanent) or moveable (e.g., removable or releasable). Such joining may be achieved with the two components or the two components and any additional intermediate components being integrally formed as a single unitary body with one another or with the two components or the two components and any additional intermediate components being attached to one another.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated.

What is claimed is:

1. An electronic device enclosure system comprising:
   an enclosure including:
      a main body with an open end;
      a cover configured to be coupled to the open end of the main body;
      an interior sized and configured to receive an electronic device therein, the interior defined by the main body and the cover; and
      a sealing member provided at an interface between the main body and the cover, such that the interface is substantially sealed and resistant to liquid ingress;
   a thermoelectric module having a first portion and a second portion, the first portion positioned within the interior of the enclosure and configured to be in confronting relation with the electronic device, the second portion in contact with a portion of the enclosure exposed to an external environment; and
   a thermal controller electrically coupled to the thermoelectric module and operable to control at least one of heating and cooling of the first portion of the thermoelectric module.

2. The electronic device enclosure system of claim 1, wherein the main body includes a base, side walls extending from the base to define the open end, and a flange extending around the ends of the side walls.

3. The electronic device enclosure system of claim 2, wherein the sealing member is flat and is disposed between the flange and the cover, such that a first side of the sealing member is in direct contact with the flange and a second side of the sealing member is in direct contact with the cover, and wherein the sealing member is compressible and deformable.

4. The electronic device enclosure system of claim 3, wherein an adhesive is used to affix the sealing member to at least one of the cover and the main body.

5. The electronic device enclosure system of claim 3, wherein one side wall of the main body includes a neck extending away from the respective side wall, and wherein the neck includes a plurality of walls that define a passage into the interior through the respective side wall.

6. The electronic device enclosure system of claim 5, further comprising a second sealing member that fills the passage, thereby forming an interface between the second sealing member and the enclosure that is substantially sealed and resistant to liquid ingress, wherein the second sealing member includes at least one groove configured to receive a cable of the electronic device, thereby forming an interface between the second sealing member and the cable that is substantially sealed and resistant to liquid ingress.

7. The electronic device enclosure system of claim 6, wherein a size of the cable is greater than a size of the at least one groove in the second sealing member, such that the second sealing member is deformed when the cable is in the groove.

8. An electronic device enclosure system comprising:
   a main body with an open end that defines an interior space sized to receive an electronic device therein;
   a cover detachably coupled to the main body at the open end so as to enclose the interior space;
   a sealing member provided between the main body and the cover, the sealing member prohibiting the ingress of liquid into the interior space between the main body and the cover; and a thermoelectric module configured to receive an electric current while positioned within the interior space and having first and second portions;
wherein when the thermoelectric module receives a first electric current, the first portion is cooled and the second portion is heated, and wherein when the thermoelectric module receives a second electric current, the first portion is heated and the second portion is cooled.

9. The electronic device enclosure system of claim 8, wherein the first electric current is conducted in a first direction and the second electric current is conducted in a second direction, which opposes the first direction.

10. The electronic device enclosure system of claim 9, further comprising a power supply disposed within the interior space and configured to provide the first and second electric currents to the thermoelectric module.

11. The electronic device enclosure system of claim 10, wherein the second portion is coupled to an inside of a sidewall of the main body, wherein a heat sink including a plurality of fins is disposed on an outside of the sidewall.

12. The electronic device enclosure system of claim 11, further comprising a second thermoelectric module having a second thermoelectric module first portion separated from the main body and a second thermoelectric module second portion coupled to an inside of a second sidewall of the main body, wherein the second thermoelectric module first portion is cooled and the second thermoelectric module second portion is heated when the second thermoelectric module receives a first electric current, and wherein the second thermoelectric module first portion is heated and the second thermoelectric module second portion is cooled when the second thermoelectric module receives a second electric current.

13. The electronic device enclosure system of claim 10, wherein the first portion is aligned adjacent to the power supply, such that heat is transferable between the first portion and the power supply, and wherein the first portion is separated from the main body and the cover within the interior space and the second portion in coupled to the main body.

14. The electronic device enclosure system of claim 8, further comprising a thermal controller disposed within the interior space, wherein the thermal controller is electrically coupled to the thermoelectric module and operable to control at least one of heating and cooling of the first portion of the thermoelectric module.

15. An electronic device enclosure system comprising:
a main body including a plurality of walls that define an open end and an interior space sized to receive an electronic device therein;
a cover detachably coupled to the main body at an interface at the open end of the main body so as to enclose the interior space, such that the ingress of liquid into the interior space through the interface is prohibited;
at least one vent coupled to one of the main body and the cover, each vent prohibiting the ingress of liquid and selectively allowing the ingress and egress of air through a vent opening therein; and
at least one valve coupled to one of the main body and the cover, each valve selectively allowing a flow of air in one direction through a valve opening.

16. The electronic device enclosure system of claim 15, further comprising:
a thermoelectric module having a first portion and a second portion, which is in contact with a portion of the main body or the cover that is exposed to an external environment, the thermoelectric module positioned within the interior space; and
a thermal controller electrically coupled to the thermoelectric module and operable to control at least one of heating and cooling of the first portion of the thermoelectric module while the thermoelectric module is positioned within the interior space.

17. The electronic device enclosure system of claim 15, wherein the at least one vent is coupled to the cover, wherein the at least one valve is coupled to the main body, and wherein each valve allows air to escape from the interior space to an exterior space when an internal pressure reaches a threshold pressure.

18. The electronic device enclosure system of claim 15, further comprising:
a sensor monitoring a humidity of the interior space; and
a controller controlling each vent and valve to regulate the flow of air into and out of the interior space thereby influencing the humidity of the interior space in response to the information from the sensor.

* * * * *